United States Patent
Hakey et al.

(10) Patent No.: US 6,548,345 B2
(45) Date of Patent: Apr. 15, 2003

(54) METHOD OF FABRICATING TRENCH FOR SOI MERGED LOGIC DRAM

(75) Inventors: Mark Charles Hakey, Milton, VT (US); William Hsioh-Lien Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,560

(22) Filed: Jan. 19, 2001

(65) Prior Publication Data

US 2001/0001719 A1 May 24, 2001

Related U.S. Application Data (62) Division of application No. 09/334,094, filed on Jun. 16, 1999.

(51) Int. Cl.[7] ............................................. H01L 21/8242
(52) U.S. Cl. ...................... 438/243; 438/244; 438/152; 438/387; 438/407; 438/423; 438/425; 438/700
(58) Field of Search .................................. 438/243, 244, 438/152, 386, 387, 404, 407, 423, 425, 700, FOR 158, FOR 221, FOR 222, FOR 212, FOR 220, FOR 430; 148/DIG. 13

(56) References Cited

U.S. PATENT DOCUMENTS

| | | | |
|---|---|---|---|
| 4,683,637 A | * | 8/1987 | Varker et al. |
| 4,916,511 A | | 4/1990 | Douglas |
| 4,997,786 A | * | 3/1991 | Kubota et al. |
| 5,429,955 A | * | 7/1995 | Joyner et al. |
| 5,561,073 A | | 10/1996 | Jerome et al. |
| 5,593,912 A | | 1/1997 | Rajeevakumar |
| 5,627,092 A | | 5/1997 | Alsmeier et al. |
| 5,732,014 A | | 3/1998 | Forbes |
| 5,733,813 A | * | 3/1998 | Chen et al. |
| 5,744,386 A | | 4/1998 | Kenney |
| 5,759,907 A | * | 6/1998 | Assaderaghi et al. |
| 5,770,484 A | | 6/1998 | Kleinhenz |
| 5,792,685 A | | 8/1998 | Hammerl et al. |
| 5,795,800 A | * | 8/1998 | Chan et al. |
| 5,811,283 A | | 9/1998 | Sun |
| 5,981,332 A | * | 11/1999 | Mandelman et al. |
| 6,303,460 B1 | * | 10/2001 | Iwamatsu .................... 438/401 |
| 6,306,703 B1 | * | 10/2001 | Noble .......................... 438/238 |
| 6,319,772 B1 | * | 11/2001 | Tee et al. ..................... 438/256 |

\* cited by examiner

*Primary Examiner*—Olik Chaudhuri
*Assistant Examiner*—Michelle Estrada
(74) *Attorney, Agent, or Firm*—Scully, Scott, Murphy & Presser; William D. Sabo, Esq.

(57) ABSTRACT

Methods of forming merged logic DRAM devices on silicon-on-insulator (SOI) wafers having a relatively thick buried oxide region, where deep trenches are etched into the SOI substrate without etching through the buried oxide layer are provided. The methods of the present invention provide high performance SOI merged logic DRAM devices.

12 Claims, 6 Drawing Sheets

METHOD OF FABRICATING TRENCH FOR SOI MERGED LOGIC DRAM

This application is a divisional of U.S. application Ser. No. 09/334,094 filed on Jun. 16, 1999.

FIELD OF THE INVENTION

The present invention relates to semiconductor processing, and in particular to methods of manufacturing merged logic dynamic access memory (DRAM) devices on a silicon-on-insulator (SOI) wafer having a relatively thick buried oxide (BOX) region formed therein. Specifically, the various methods of the present invention provide merged logic DRAM devices wherein the deep trenches for the storage capacitor are etched into the SOI without etching through the BOX region present in the logic portion of the device. The methods of the present invention allow for fabricating high performance SOI merged logic DRAM devices.

BACKGROUND OF THE INVENTION

In the field of semiconductor device manufacturing, merged logic DRAM devices are becoming increasingly important. This is so since the coupling of logic devices with DRAM cells provides a device which has all the benefits of DRAMs, but having the speed of conventional logic devices to improve bandwidth and performance.

Currently, one of the key problems in manufacturing merged logic DRAM devices is etching deep trenches (on the order of 6000 to 10,000 nm (6 to 10 microns) in the substrate) for the fabrication of storage capacitors. This difficulty is caused by the need to use a very thick hard mask such as $SiO_2$ as a masking material for reactive ion etching (RIE). The requirement of using a hard masking material for RIE has stretched current trench storage DRAM technologies to its limit.

Moreover, for high performance devices there is a trend in switching from using conventional bulk semiconductor wafers to silicon-on-insulator (SOI) wafers. In SOI wafers, a very thick buried oxide (BOX) region, on the order of about 800 to about 5000 Å, is typically present. This BOX region makes deep trench RIE even more difficult, if not impossible, due to hard mask consumption during the RIE process.

In view of the above drawbacks with manufacturing prior art merged logic DRAM devices, there is a continued need for developing new and improved methods of forming a deep trench storage capacitor in such structures wherein an SOI substrate having a BOX region is employed. Such methods must be capable of providing a deep trench in the SOI wafer without consumption of any BOX region that is present in the logic portion of the device.

SUMMARY OF THE INVENTION

One object of the present invention is to provide a method of manufacturing a merged logic DRAM device wherein the deep trench storage capacitor can be formed without having to etch through the buried oxide layer that is present in the logic portion of the SOI substrate.

Another object of the present invention is to provide a method of manufacturing high performance SOI merged logic DRAM devices.

A further object of the present invention is to provide a method which utilizes existing semiconductor processing technology to fabricate an SOI merged logic DRAM device.

These, and other objects and advantages are obtained in the present invention by employing various processing schemes which are capable of etching deep trenches in the array portion of an SOI substrate without etching the thick BOX region in the logic portion of the SOI substrate. Specifically, the present invention provides methods for forming a merged logic DRAM device on an SOI wafer having a relatively thick BOX region, wherein a deep trench is etched into the SOI substrate without etching through the BOX layer present in the logic portion of the substrate.

In one method of the present invention, a high performance SOI merged logic DRAM device is formed using the following processing steps:

(a) providing an SOI substrate having a buried oxide layer formed therein, said SOI substrate further comprising selected areas for forming array devices and selected areas for forming logic devices;

(b) forming an insulator layer on a surface of said SOI substrate;

(c) forming a blockout photoresist pattern on said insulator layer over said selected logic device areas;

(d) etching said insulator layer so as to remove said insulator layer in said selected array device areas;

(e) etching the SOI substrate through said BOX layer in said selected array device areas;

(f) removing said patterned photoresist located over said selected logic device areas;

(g) forming an epitaxial silicon layer in the etched areas of said selected array device areas;

(h) forming a deep trench mask pattern over said selected array device areas; and (i) etching a deep trench in said selected array device areas.

It is noted that the deep trench is formed in the selected array device areas without etching through the BOX layer in the logic device areas using conventional lithography and reactive ion etching (RIE). After conducting step (i), the array devices and logic devices can be formed using conventional methods well known in the art.

In a second method of the present invention, an SOI merged logic DRAM device is formed using the following processing steps:

(a) providing a silicon substrate having an insulator layer formed thereon, said substrate further comprising selected areas for forming array devices and selected areas for forming logic devices;

(b) forming a photoresist on said insulator layer;

(c) providing an opening in said photoresist and said insulator layer in areas wherein the array devices will be formed;

(d) etching a trench through said opening into said silicon substrate;

(e) removing said photoresist;

(f) filling said trench with a trench fill material;

(g) removing said insulator layer;

(h) forming a sacrificial oxide layer on said silicon substrate;

(i) forming a continuous BOX layer in said silicon substrate;

(j) providing a planarized structure; and (k) removing said trench fill material and said BOX layer from said trench.

After conducting processing steps (a)–(k), the array and logic devices can be formed in the selective regions using conventional techniques well known to those skilled in the art.

In a third method of the present invention, an SOI merged logic DRAM device is fabricated as follows:

(a) providing a silicon substrate having an insulator layer formed thereon said substrate further comprising selected areas for forming array devices and selected areas for forming logic devices;

(b) forming a photoresist on said insulator layer;

(c) providing an opening in said photoresist and said insulator layer in areas wherein the array devices will be formed;

(d) etching a trench through said opening into said silicon substrate;

(e) removing said photoresist;

(f) forming a sacrificial oxide layer on said silicon substrate and in the bottom of said trench;

(g) forming a discontinuous BOX layer in said substrate abutting said trench as well as a BOX region under said trench; and (h) removing said sacrificial oxide layer on said silicon substrate and in said trench.

After conducting the above processing steps of the third method of the present invention, the array and logic devices can be formed in the selective regions using conventional techniques well known to those skilled in the art.

DETAILED DESCRIPTION OF THE INVENTION

The present invention, which provides various methods for fabricating merged logic DRAM devices on SOI substrates having a relatively thick BOX layer therein, wherein deep trenches are etched into the SOI substrate without etching through the BOX layer present in the logic device areas, will now be described in greater detail by referring to the drawings that accompany the present application. It is noted that in the drawings like reference numerals are used for describing like and/or corresponding elements.

Reference is first made to FIGS. 1(a)–(g) which illustrate the first method of the present invention. In the first method of the present invention, an SOI substrate 10 having a relatively thick BOX layer 12 therein is first provided. In addition to the thick BOX layer, the SOI substrate comprises two regions of bulk silicon 10a.

Figure 1A:
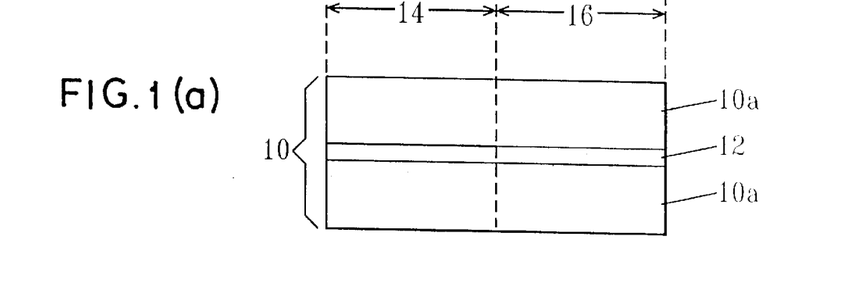
FIGS. 1(a)–(g) show various processing steps of the first method of the present invention that are used in forming an SOI merged logic DRAM device.

The SOI substrate, which is shown in FIG. 1(a), is fabricated using conventional techniques that are well known to those skilled in the art. For example, conventional SIMOX (separation by implantation of oxygen) processes can be employed to form the buried oxide layer in bulk silicon. As is well known, SIMOX processes use a high energy, high oxygen dose implant step (oxygen dosage of about $4\times10^{17}$ cm$^{-2}$ or above) and a high annealing step (1200° C. or above) to form the BOX layer. In conventional SIMOX processes, the ion dose used in the implantation step is the source for growing the buried oxide layer.

In addition to using conventional SIMOX processes to form he BOX region, the present invention also contemplates the use of the technique described in coassigned U.S. patent aplication Ser. No. 08/995,58, filed Dec. 22, 1997, the contents of which are being incorporated herein by reference. Briefly, the technique disclosed in the above-identified coassigned U.S. patent application, uses the following processing steps to create a BOX layer in bulk silicon: First, a stable buried damaged region is created in the bulk silicon using a low dose ion implantation step. Next, an amorphous layer is created adjacent to said stable buried damaged region and thereafter the structure is oxidized under conditions that are sufficient to diffuse oxygen into the bulk silicon thereby forming a continuous BOX region therein. An optional annealing step may be employed after the oxidation step.

Not withstanding which technique is employed in forming the BOX layer in bulk silicon, the thickness of the BOX layer is typically of from about 800 to about 5000 Å. More preferably, the thickness of the BOX region is from about 1500 to about 4000 Å.

It is noted that the SOI substrate shown in FIG. 1(a) contains a selected area for fabricating an array device, i.e. DRAM, and a selected area for fabricating a logic device. These areas are labeled as 14 and 16, respectively. Although the drawings of the present invention show only one of each selected device region on the SOI substrate, multiple device regions can be present on the SOI substrate.

Figure 1B:
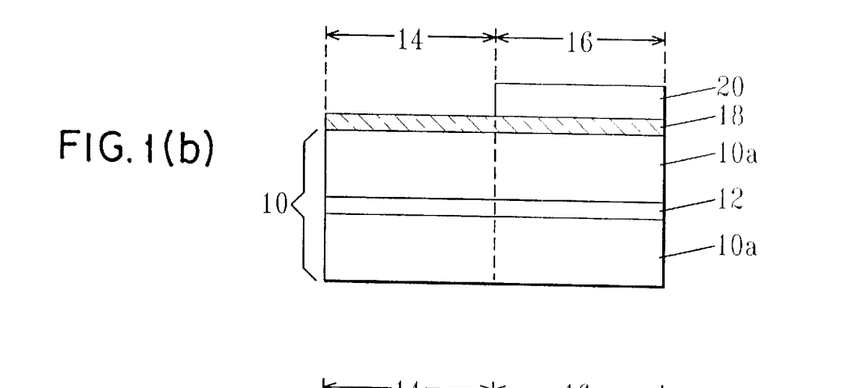

In accordance with the next step of the first method of the present invention, an insulator layer 18 is first formed on the surface of SOI substrate 10 and thereafter a photoresist 20 is formed on the surface of insulator layer 18 that is only above the selected logic device areas of the SOI substrate. The SOI structure, after forming layers 18 and 20, is shown in FIG. 1(b). The insulator layer and photoresist are composed of conventional materials that are well known to those skilled in the art. For example, insulator layer 18 may be composed of any insulating material including, but not limited to: oxides such as $SiO_2$ and nitrides such as $Si_3N_4$; whereas photoresist 20 is composed of a conventional resist material.

Layers 18 and 20 are formed using conventional deposition processes that are well known to those skilled in the art. For example, the two layers, e.g. layers 18 and 20, can be formed using chemical vapor deposition (CVD), plasma-assisted CVD, sputtering, spin-on coating and other like deposition processes. Conventional lithography and RIE is employed in providing the photoresist to only the selected logic device areas of the SOI substrate. The thickness of the two layers is not critical to the present invention. Nevertheless, the thickness of insulator layer 18 should be at least from about 400 to about 800 nm; while the thickness of photoresist 20 should be sufficient to RIE the insulator.

Figure 1C:
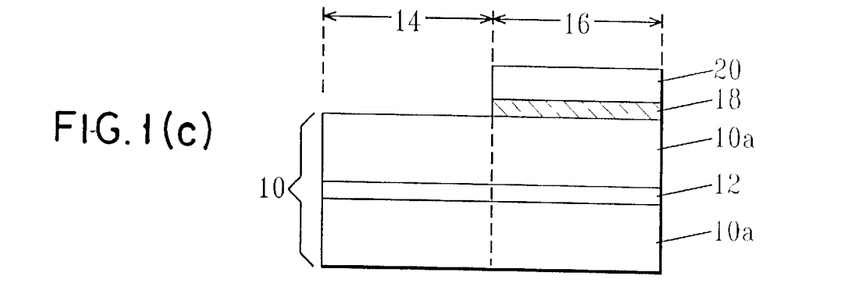

The exposed insulator layer 18 located in the selected array device areas is then removed using conventional dry etching techniques such as RIE, plasma etching and ion beam etching. A highly preferred technique employed in removing insulator layer 18 in the selected array device areas is RIE. The structure, after removing insulator layer 18 in the selected array device arrays, is shown in FIG. 1(c).

Figure 1D:
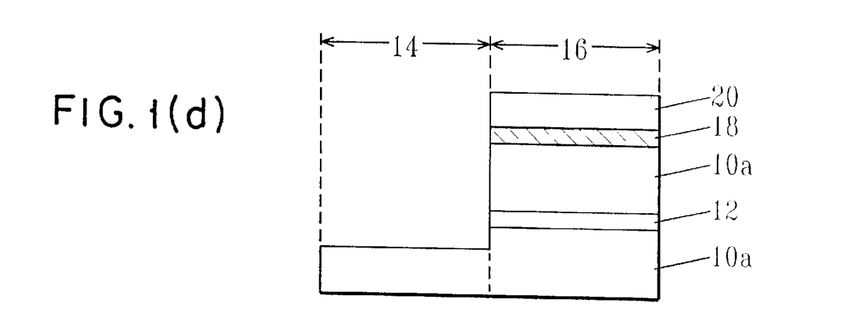

In accordance with the next step of the present method, the exposed array device area is then subjected to etching so that the etching removes the bulk silicon 10a over the BOX layer, the BOX layer 12 and a portion of bulk silicon 10a under the BOX layer in the array device area. Etching is carried out using conventional dry etching techniques including, but not limited to: reactive ion etching (RIE), plasma etching and ion beam etching. Of these dry etching techniques, RIE is highly preferred in this step of the present invention. The etched structure is shown in FIG. 1(d).

Figure 1E:
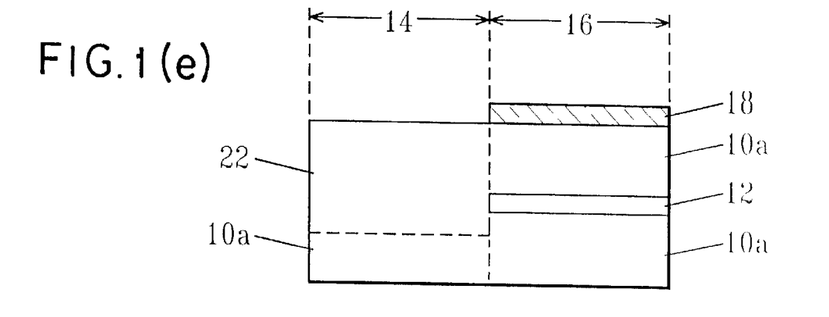

After stripping off resist layer 20, an epitaxial layer 22 is grown in the etched areas of the structure using selective epitaxial growing techniques that are well known to those skilled in the art. The structure containing the epitaxial grown Si layer is shown in FIG. 1(e). It should be noted that the epitaxial layer is composed of the same material as 10a; therefore, epitaxial layer 22 will not be specifically labeled in the remaining drawings. Instead, reference numeral 10a will again be used. It is further noted that in FIG. 1(e) no BOX layer is found in the array device area of the SOI substrate. This allows for fabrication on a deep storage capacitor in the array device areas of the structure without etching through the BOX layer.

Figure 1F:
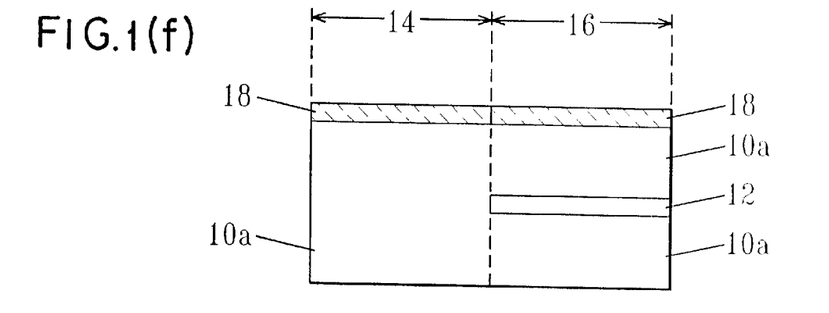

Next, as shown in FIG. 1(f), a thick lave of insulator is deposited onto the array portion of the wafer as an etch mask for deep trench etching. The insulator may be composed of the same or different insulator as layer 18.

Figure 1G:
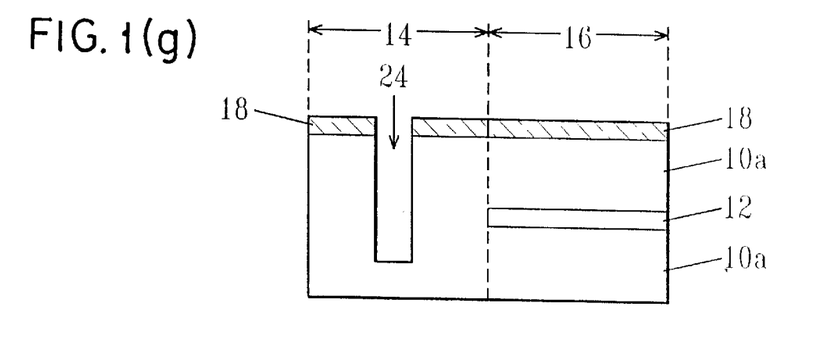

A deep trench 24 is formed in the selected array device areas using conventional lithography and etching, See FIG. 1(g). The term "deep" is used herein to denote a trench that has a depth of from about 6000 to about 10,000 nm. The trench is then filled using conventional materials and techniques that are well known for forming a deep storage capacitor. A detailed description of suitable fabrication means for forming a deep trench capacitor is found, for example, in U.S. Pat. No. 4,801,988, the contents of which are being incorporated herein by reference.

The remaining array devices and logic devices are then formed on the surface of the structure using conventional techniques known in the art.

The above description relates to the first method of the present invention, the following description, with reference to FIGS. 2(a)–(h), is directed to the second method of the present invention. In this method, a silicon substrate 13 having an insulator layer 18 formed thereon is first provided, See FIG. 2(a). Like the SOI substrate of FIG. 1(a), the silicon substrate shown in FIG. 2(a) has a selected array device area 14 and a selected logic device area 16. The insulator aver can be one of the previous mentioned insulating materials and it can be formed on the Si substrate using the previous mentioned deposition processes.

The next step of the second method of the present invention comprises forming a photoresist 20 on the surface of the insulator layer. Any of the above mentioned resists and deposition methods can be used in forming the structure shown in FIG. 2(b).

Figure 2A:
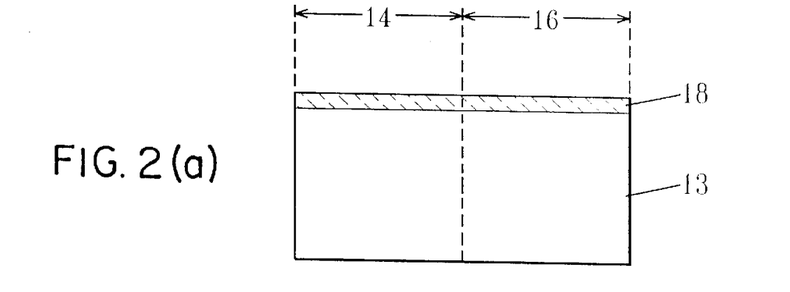
FIGS. 2(a)–(h) show various processing steps of the second method of the present invention that are used in forming an SOI merged logic DRAM device.
Figure 2B:
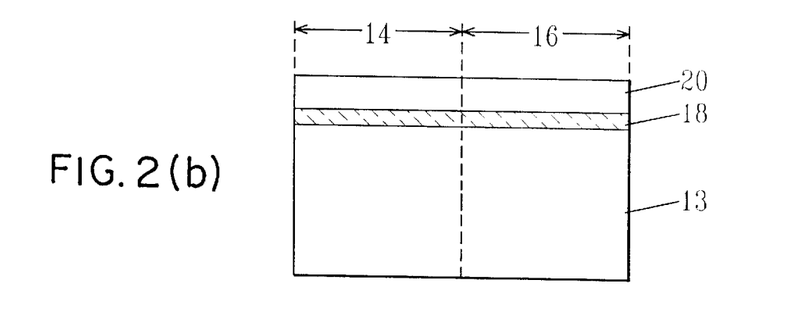
Figure 2C:
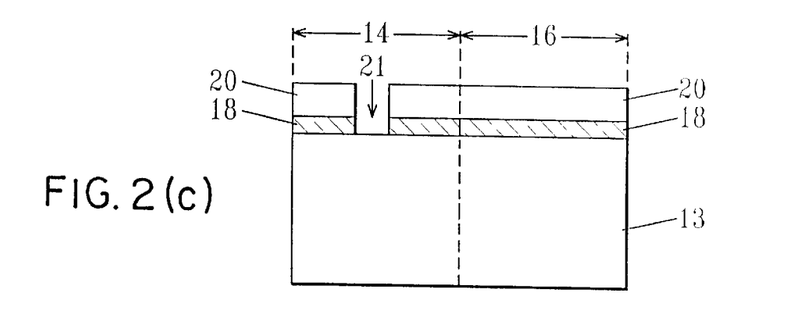
Figure 2D:
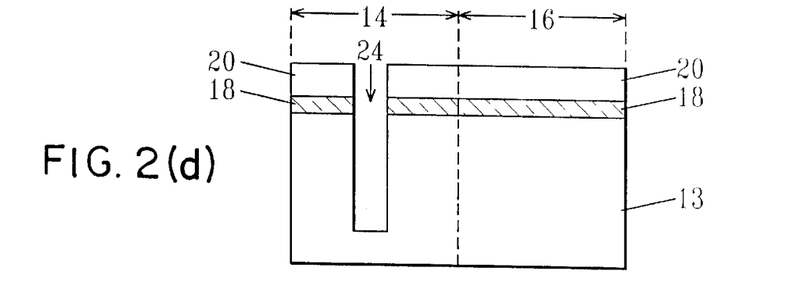
Figure 2E:
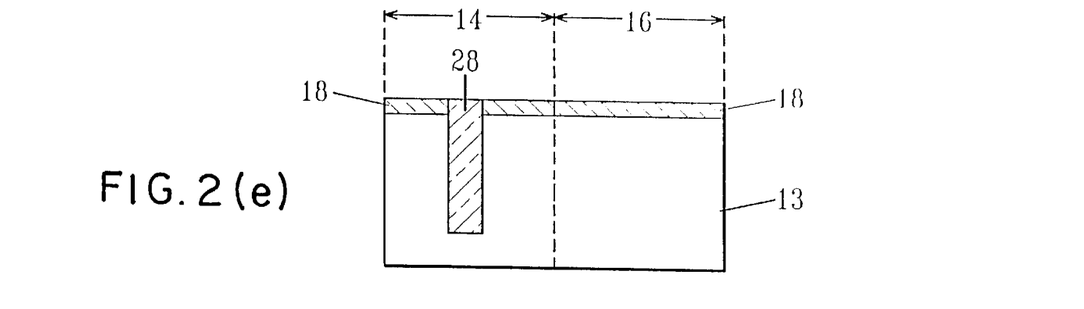

An opening 21 is then formed through layers 20 and 18 in the selected array device areas of the structure shown in FIG. 2(b) using conventional RIE or another suitable dry etch process, See FIG. 2(c). As shown in FIG. 2(c), opening 21 defines the area in which the deep trench will be formed. Deep trench 24 is then formed through the opening using a conventional dry etching technique such as RIE, plasma etching or ion beam etching. The structure containing the deep trench is shown in FIG. 2(d).

In accordance with the next step of the second method of the present invention, the photoresist over the entire structure is removed using conventional stripping techniques well known to those skilled in the art. A stack layer comprising a grown oxide layer and a nitride layer is then formed on the insulator layer and then the deep trench is filled with a sacrificial trench fill material 28, e.g. polysilicon, an oxide, or a nitride. The structure is then planarized to remove the stack layer therefrom providing the structure shown in FIG. 2(e).

Figure 2F:
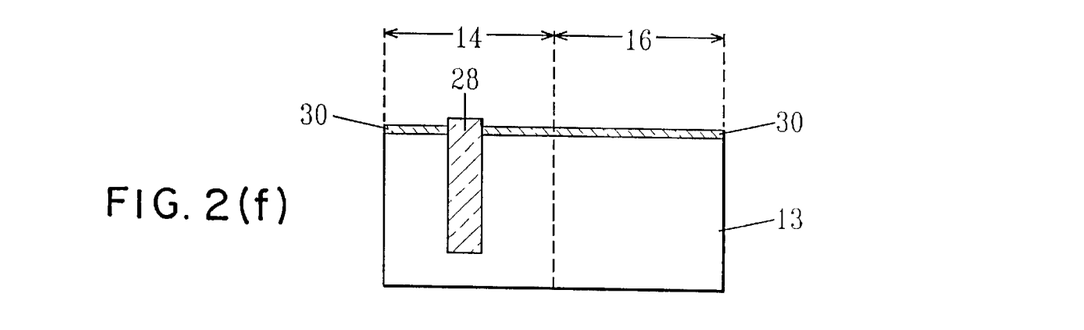

The insulator layer is next removed using standard techniques mentioned above and thereafter sacrificial oxide layer 30 is formed of the surface of the Si substrate. The sacrificial oxide layer which is used in forming the BOX layer may be thermally grown using conventional growing processes well known to those skilled in the art or it can be deposited using CVD or another conventional deposition process. The structure containing the sacrificial layer is shown in FIG. 2(f).

Figure 2G:
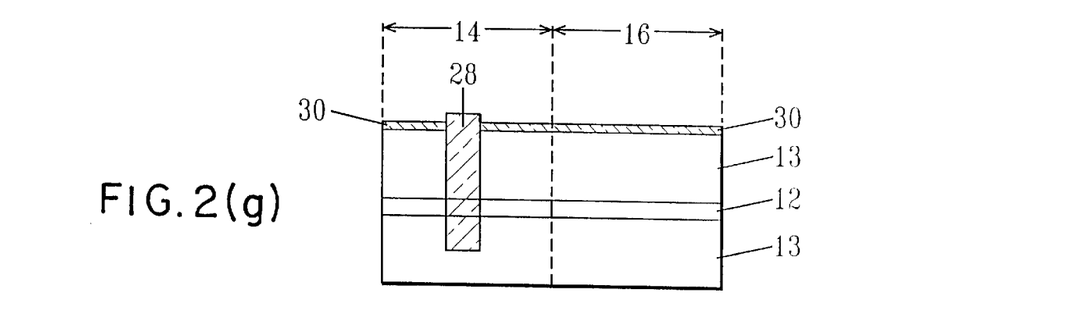

FIG. 2(g) illustrates the next step of the second method of the present invention wherein a continuous BOX layer 12 is formed in the Si substrate by one of the above mentioned methods that are employed in forming the BOX region in FIG. 1(a). That is, conventional SIMOX or the method described in coassigned U.S. application '585 can be used in forming the continuous BOX layer. As is illustrated in FIG. 2(g), a continuous BOX region is formed in the substrate as well as the deep trench region.

Figure 2H:
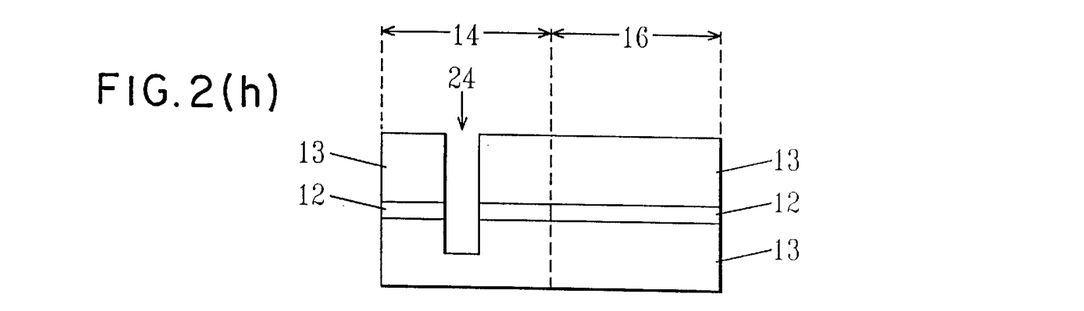

An insulator layer, such as a nitride or an oxide, is then formed on the surface of the structure shown in FIG. 2(g) using conventional deposition processes and that structure is then planarized to the Si substrate. Next, the trench fill material and the BOX layer formed in the trench is removed using standard etching techniques including one of the previous mentioned dry etching processes or a wet etch process that employs a chemical etchant such as hot phosphoric acid that is highly selective in removing the trench fill material and the BOX layer inside the trench. The structure, after trench fill removal and BOX removal, is shown in FIG. 2(h).

The trench is then refilled as described above and the remaining array devices and Logic devices are then formed on the surface of the structure using conventional techniques known in the art.

The third method of the present invention is now described in detail with reference to FIGS. 3(a)–(g) Specifically, as shown in FIGS. 3(a)–(d), the third method of the present invention utilizes the initial processing steps of the second method. This includes providing the Si substrate shown in FIG. 3(a), forming a photoresist on the structure (FIG. 3(b)), providing an opening in the photoresist and insulator layer located in the selected array device areas of the structure (FIG. 3(c)), and then etching the deep trench (FIG. 3(d)).

Figure 3A:
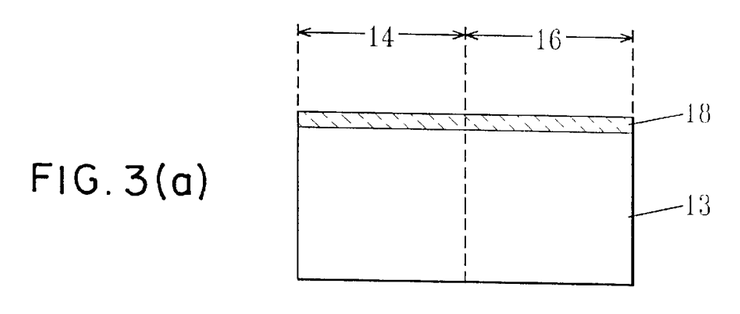
FIGS. 3(a)–(g) show various processing steps of the third method of he present invention that are used in forming an SOI merged logic DRAM device.
Figure 3B:
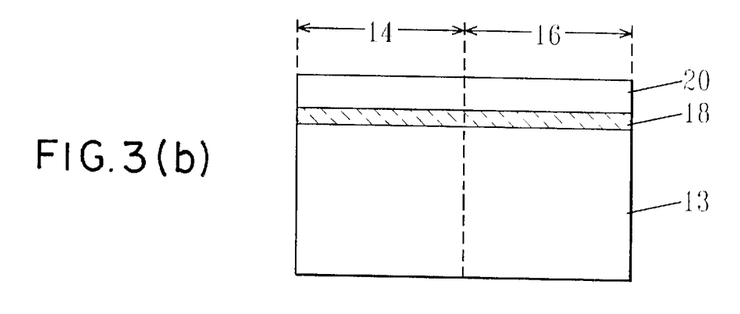
Figure 3C:
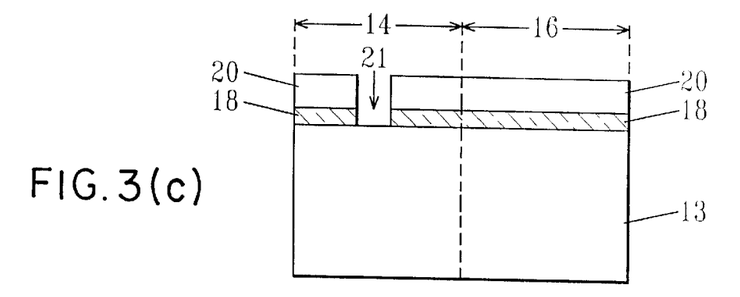
Figure 3D:
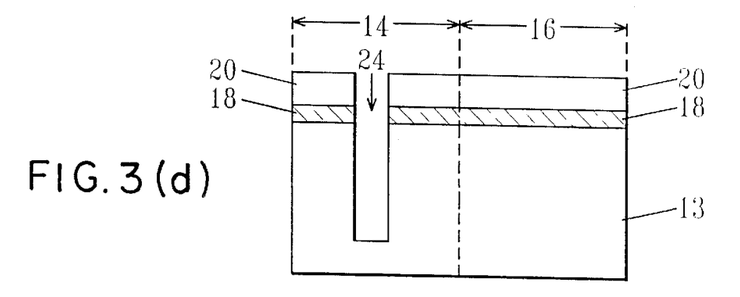
Figure 3E:
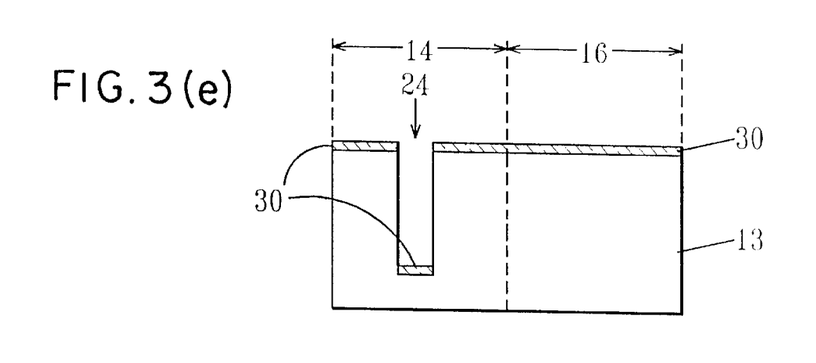
Figure 3F:
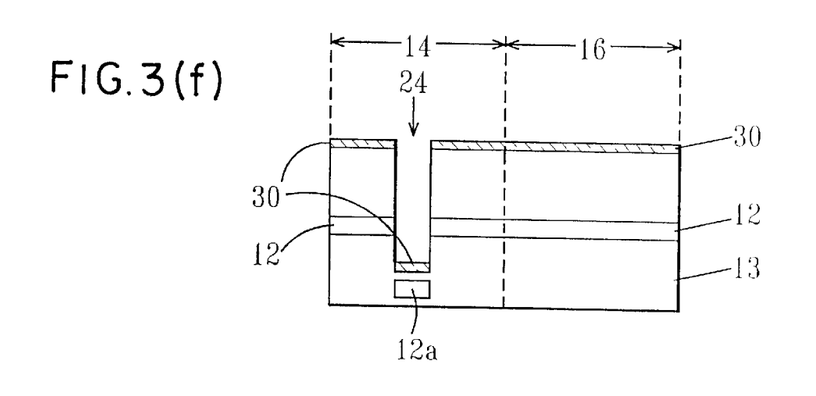

After forming the deep trench in the Si substrate, the photoresist and the insulator layer are removed using any of the above mentioned stripping techniques and thereafter a sacrificial oxide layer 30 is formed on the surface of the Si substrate as described above. This structure is shown in FIG. 3(e). Unlike the previous described method, the third method contemplates forming a sacrificial oxide layer 30 in the bottom of the trench as well as on the surface of the Si substrate.

Next, a discontinuous BOX layer 12 is formed in the Si substrate using one of the processes mentioned above so as to form he structure shown in FIG. 3(f). It is noted that in this figure, a small buried oxide layer 12a having nearly the same width of the trench is formed underneath the trench.

Figure 3G:
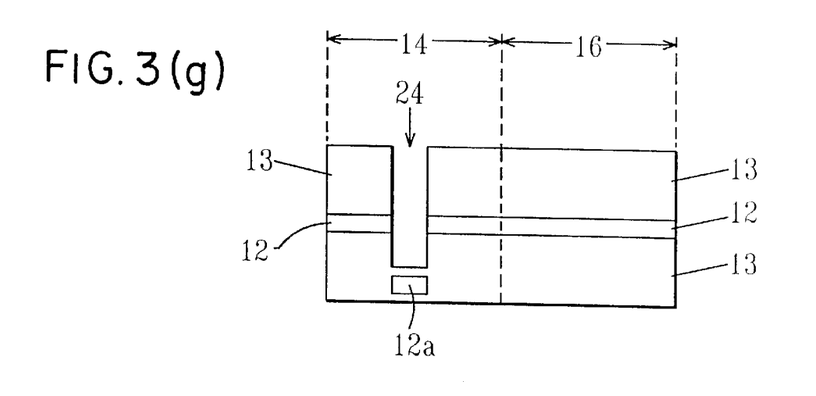

The sacrificial oxide layer is then removed, as shown in FIG. 3(g), and the trench is then filled as described above and the remaining array devices and logic devices are then formed on the surface of the structure using conventional techniques known in the art.

While the present invention has been described and shown in respect to preferred embodiments thereof, it will be understood by those skilled in the art that the foregoing and other changes in form and detail may be made without departing from the spirit and scope of the present application. It is therefore intended that the present application not be limited to the exact forms described and illustrated, but fall within the scope of the appended claims.

Having thus described our invention in detail, what we claim as new and desire to secure by the Letters Patent is:

1. A method of forming a merged logic DRAM device having a trench etched into a silicon-on insulator (SOI) substrate without etching into a buried oxide (BOX) layer present in said SOI substrate, said method comprising the steps of;

providing a silicon substrate having an insulator layer formed thereon, said substrate further comprising selected array device areas and selected logic device areas;

forming a photoresist on said insulator layer;

providing an opening in said photoresist and said insulator layer in said selected array device areas;

etching the trench through said opening into said silicon substrate;

removing said photoresist;

filling said trench with a trench fill material;

removing said insulator layer;

forming a sacrificial oxide layer on said silicon substrate;

forming said continuous BOX layer in said silicon substrate;

planarizing the resulting structure; and removing said trench fill material and said BOX layer from said trench.

2. The method of claim 1 wherein said insulator layer comprises an oxide or a nitride.

3. The method of claim 1 wherein said insulator layer and said photoresist are formed using a deposition process selected from the group consisting of chemical vapor deposition, plasma assisted chemical vapor deposition, sputtering and spin-coating.

4. The method of claim 1 wherein said opening is formed by a dry etching process selected from the group consisting of reactive ion etching, plasma etching and ion beam etching.

5. The method of claim 1 wherein said trench is formed by reactive ion etching.

6. The method of claim 1 wherein said photoresist is removed using a chemical etchant that is selective in removing the photoresist.

7. The method of claim 1 wherein said trench fill material is polysilicon, an oxide, or a nitride.

8. The method of claim 1 wherein said sacrificial oxide layer is thermally grown or formed using a deposition process.

9. The method of claim 1 wherein said trench fill material and said BOX layer are removed using a dry etching process or a wet etching process.

10. The method of claim 9 wherein said dry etching process comprises reactive ion etching, plasma etching or ion beam etching.

11. The method of claim 9 wherein said wet etching process comprises the use of phosphoric acid.

12. The method of claim 1 wherein said trench is refilled with a trench fill material.

* * * * *